United States Patent
Basu et al.

(10) Patent No.: US 9,748,357 B2
(45) Date of Patent: Aug. 29, 2017

(54) III-V MOSFET WITH STRAINED CHANNEL AND SEMI-INSULATING BOTTOM BARRIER

(71) Applicant: International Business Machines Corporation, Armonk, NY (US)

(72) Inventors: Anirban Basu, Lagrangeville, NY (US); Guy Cohen, Ossining, NY (US); Amlan Majumdar, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/229,198

(22) Filed: Aug. 5, 2016

(65) Prior Publication Data

US 2016/0343826 A1    Nov. 24, 2016

Related U.S. Application Data

(62) Division of application No. 14/592,130, filed on Jan. 8, 2015, now Pat. No. 9,472,667.

(51) Int. Cl.
| | |
|---|---|
| *H01L 29/10* | (2006.01) |
| *H01L 29/66* | (2006.01) |
| *H01L 29/78* | (2006.01) |
| *H01L 29/20* | (2006.01) |
| *H01L 29/06* | (2006.01) |

(52) U.S. Cl.
CPC .... *H01L 29/66522* (2013.01); *H01L 29/0649* (2013.01); *H01L 29/1033* (2013.01); *H01L 29/1054* (2013.01); *H01L 29/1079* (2013.01); *H01L 29/20* (2013.01); *H01L 29/7842* (2013.01); *H01L 29/7849* (2013.01)

(58) Field of Classification Search
CPC ............. H01L 29/7842; H01L 29/1079; H01L 29/1033; H01L 29/66522; H01L 29/20
See application file for complete search history.

(56) References Cited

U.S. PATENT DOCUMENTS

| | | | |
|---|---|---|---|
| 6,444,516 B1 | 9/2002 | Clevenger et al. | |
| 7,439,605 B2 | 10/2008 | Kobayashi et al. | |
| 7,700,973 B2 | 4/2010 | Shen et al. | |
| 8,518,768 B2 | 8/2013 | Datta et al. | |

(Continued)

FOREIGN PATENT DOCUMENTS

| | | |
|---|---|---|
| DE | 4000599 A1 | 7/1991 |
| GB | 1398808 | 6/1975 |
| KR | 19890004643 A | 9/1989 |

OTHER PUBLICATIONS

Appendix P: List of IBM Patents or Patent Applications Treated As Related, Dated , pp. 1-2.

*Primary Examiner* — Roy Potter
*Assistant Examiner* — Paul Patton
(74) *Attorney, Agent, or Firm* — Edward J. Wixted, III

(57) ABSTRACT

Embodiments include a method for fabricating a semiconductor device and the resulting structure comprising forming a semi-insulating bottom barrier on a semiconductor substrate. A channel is formed on the bottom barrier. A semi-insulating layer is epitaxially formed on the bottom barrier, laterally adjacent to the channel. The semi-insulating layer is formed in such a way that stress is induced onto the channel. A CMOS transistor is formed on the channel.

7 Claims, 4 Drawing Sheets

(56) References Cited

U.S. PATENT DOCUMENTS

| | | | |
|---|---|---|---|
| 8,592,803 B2 | 11/2013 | Pillarisetty et al. | |
| 2008/0237636 A1* | 10/2008 | Jin | H01L 29/1054 |
| | | | 257/190 |
| 2013/0161698 A1* | 6/2013 | Marino | H01L 29/42316 |
| | | | 257/194 |
| 2013/0234113 A1 | 9/2013 | Majhi et al. | |
| 2014/0077229 A1 | 3/2014 | Liu et al. | |
| 2016/0204253 A1 | 7/2016 | Basu et al. | |

\* cited by examiner

III-V MOSFET WITH STRAINED CHANNEL AND SEMI-INSULATING BOTTOM BARRIER

BACKGROUND OF THE INVENTION

The present invention relates generally to the fabrication of semiconductor devices, and more particularly to the fabrication of a metal oxide silicon field effect transistor (MOSFET) device.

A field-effect transistor (FETs) can be a semiconductor device fabricated on a bulk semiconductor substrate or on a silicon-on-insulator (SOI) substrate. FET devices each generally consist of a source, a drain, a gate, and a channel between the source and drain. The gate is separated from the channel by a thin insulating layer, typically of silicon oxide, called the gate oxide. A voltage applied to the gate across the oxide layer induces a conducting channel between the source and drain, thereby controlling the current flow between the source and the drain. Current integrated circuits often use complementary metal-oxide-semiconductor (CMOS) technology that use complementary and symmetrical pairs of p-channel and n-channel metal oxide semiconductor field effect transistors (MOSFETs) for logic functions.

Group IV semiconductors such as, silicon (Si) and germanium (Ge), are used in conventional CMOS technology. The scaling of the gate length of the MOSFETs have led to faster transistors, circuits, and microprocessors. However, gate length scaling is now facing significant challenges due to high off-state leakage current, increased power consumption, and non-scalability of the operating voltage. The use of low effective mass semiconductor materials, such as many Group III-V compound semiconductors, provide an increase in the maximum obtainable velocity of charge carriers such as electrons and holes.

It is well known that imparting strain to the channel of FETs leads to higher carrier velocities. For example, uniaxial tensile strain leads to higher electron velocity that enhances the performance of n-channel field effect transistors (NFETs) while uniaxial compressive strain leads to higher hole velocity that enhances the performance of p-channel field effect transistors (PFETs). Therefore, MOSFET structures with low effective mass semiconductors and strained channels are highly desired.

Yet another important feature of CMOS technology is that the source and the drain of the FET should not conduct other than through the channel. In conventional Si-based CMOS technology, isolation is achieved using well implants. The well implant method leads to poor isolation in III-V FETs due to low levels of dopant activation that are obtained in III-V semiconductors.

SUMMARY

As disclosed herein, a method of fabricating a semiconductor device and the resulting structure include forming a semi-insulating bottom barrier on a semiconductor substrate, forming a channel on the bottom barrier, and epitaxially forming another semi-insulating layer on the bottom barrier, laterally adjacent to the channel. The semi-insulating layers are formed in such a way that strain is induced onto the channel and substantially no strain is induced onto the bottom barrier. A CMOS transistor may be formed on the channel. A corresponding semiconductor device is also disclosed herein.

DETAILED DESCRIPTION

Figure 1:
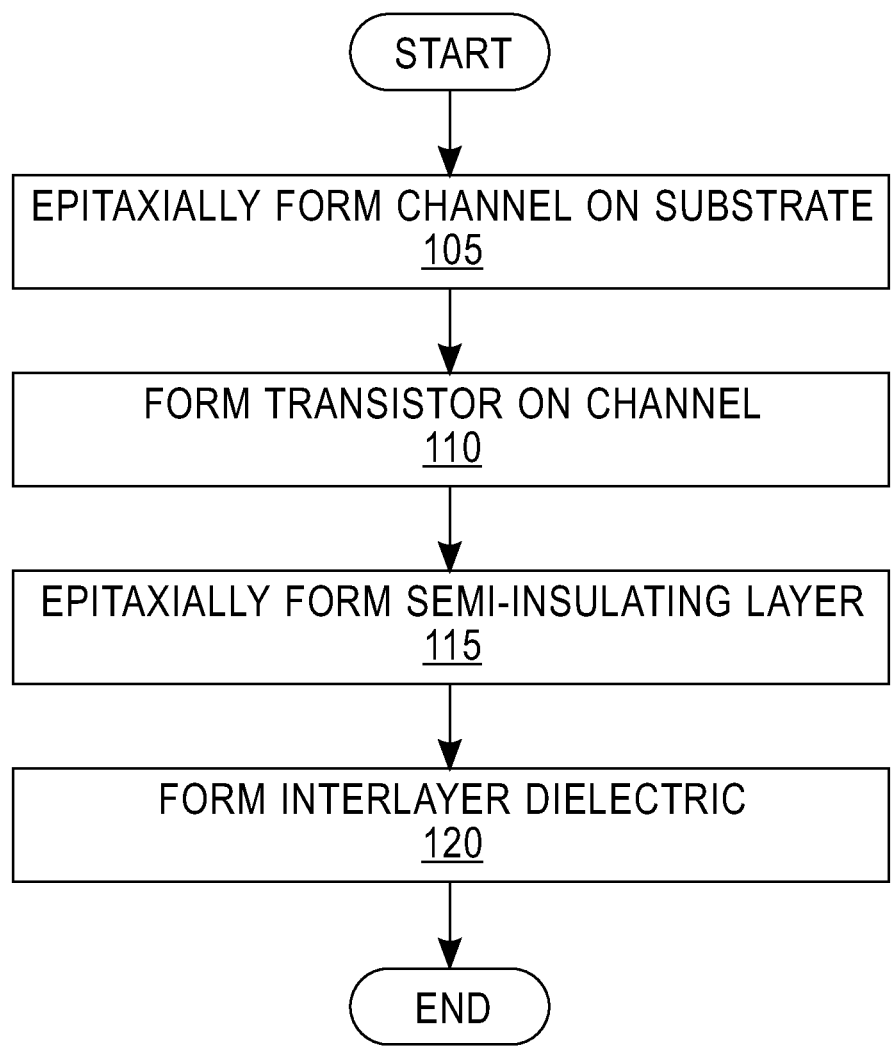
FIG. 1 is a flowchart depicting the operational steps of a method of forming a MOSFET transistor with a strained channel and a semi-insulating bottom barrier, in accordance with an embodiment of the invention.

Embodiments of the present invention generally provide a metal oxide semiconductor field effect transistor (MOSFET) device with a strained channel and relaxed semi-insulating bottom barrier. A detailed description of embodiments of the claimed structures and methods are included herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

The present invention will now be described in detail with respect to the figures.

FIG. 1 is a flowchart depicting the operational steps of a method of forming a MOSFET transistor with a strained channel and semi-insulating bottom barrier, in accordance with the depicted embodiment of the invention. Inducing strain onto the channel of a transistor allows for the conductivity of the channel to be changed in a predictable manner.

In step 105, channel layer 410 is epitaxially formed on bottom barrier 310 in accordance with the embodiment of the invention depicted in FIGS. 2-5. In various embodiments, channel layer 410 is composed of a III-V semiconductor material. In preferred embodiments, channel layer 410 is composed of indium gallium arsenide (InGaAs). It should be appreciated by one skilled in the art that in other embodiments channel layer 410 is composed of other III-V semiconductor materials, and the examples provided are not meant to be limiting to only embodiments where channel layer 410 is composed of InGaAs. It should additionally be appreciated by one skilled in the art that while this embodiment depicts the formation of a MOSFET transistor on a semiconductor substrate including a semi-insulating bottom barrier (bottom barrier 310), the invention is not limited to embodiments where the semiconductor substrate comprises a semi-insulating bottom barrier and underlying semiconductor material, and that many other types of semiconductor substrate construction can be used, such as silicon on insulator (SOI) construction, bulk silicon, or any other method of construction known in the art for fabricating a semiconductor device.

Epitaxially forming channel layer 410 on bottom barrier 310 involves forming channel layer 410 using a process such as molecular beam epitaxy (MBE), metal organic chemical vapor deposition (MOCVD), atomic layer deposition (ALD), or any other technique for epitaxially growing a layer of a semiconductor material such that the lattice constant of channel layer 410 is matched to the lattice constant of bottom barrier 310. In the depicted embodiment, the material of which channel layer 410 is formed differs from the material of which bottom barrier 310 is formed, and as a result the two materials have different normal lattice constants, that is, the lattice constants of the two materials in their respective relaxed crystal structures are different. The difference between the normal lattice constant for the material of which channel layer 410 is composed and the lattice constant inherited from bottom barrier 310 during epitaxial growth causes channel layer 410 to exist in a state of either tension or compression, herein referred to as a strain, once channel layer 410 is formed epitaxially on bottom barrier 310. The strain induced to channel layer 410 by bottom barrier 310 results in a change in the conductivity of channel layer 410 in a predictable manner which can be controlled based on the selection of the materials of which bottom barrier 310 and channel layer 410 are formed. In a preferred embodiment of the invention, the ratio of indium to gallium arsenide present in channel layer 410 is manipulated in order to control the type and magnitude of stress which is induced to channel layer 410 as a result of the epitaxial growth.

Figure 5:
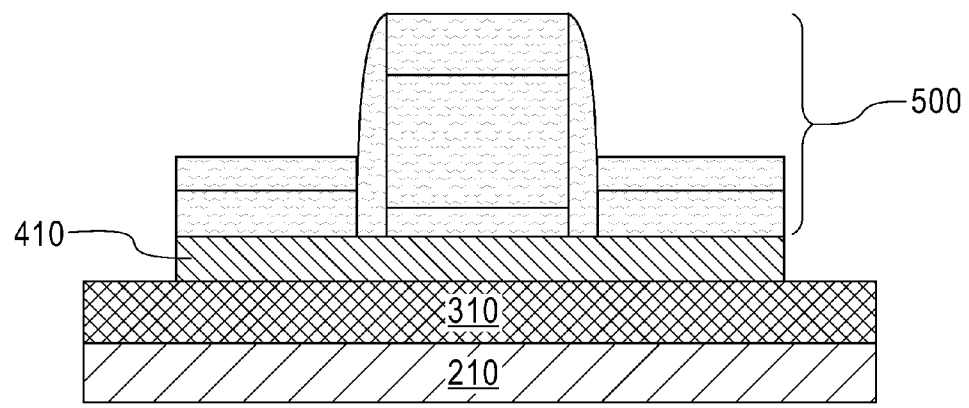
FIG. 5 illustrates formation of a CMOS transistor on the channel of FIG. 4, in accordance with an embodiment of the invention.

In step 110, complementary metal oxide semiconductor (CMOS) transistor 500 is formed on channel layer 410. It should be appreciated by one skilled in the art that the invention is not limited to the raised source drain type of MOSFET transistor shown in FIG. 5, and that any kind of CMOS transistor can be formed in step 110. Additionally, it should be appreciated that the embodiment depicted in FIG. 5 illustrates an embodiment where the current MOSFET device is not being manufactured "at pitch", such as an embodiment where the density of electrical devices such as the current MOSFET device is not of interest. In embodiments where the current MOSFET device is being manufactured "at pitch", CMOS transistor 500 may incorporate a common source and drain terminal between consecutive devices.

In step 115, a semi-insulating layer is formed on bottom barrier 310 adjacent to channel layer 410. In the depicted embodiments of FIG. 6A, semi-insulating layer 610 is epitaxially formed on bottom barrier 310 adjacent to channel layer 410. The step of forming semi-insulating layer 610 also includes removing a portion of channel layer 410 and exposing the top surface of bottom barrier 310 using, for example, wet chemical etching or dry etching. In the depicted embodiment, standard photolithographic processes are used to define the pattern of channel layer 410 to be etched in a layer of photoresist (not shown) deposited on channel layer 410. Channel layer 410 may be partially removed by removing channel layer 410 from the areas not protected by the pattern in the photoresist layer. Channel layer 410 is removed using, for example, reactive ion etching (RIE). RIE uses chemically reactive plasma, generated by an electromagnetic field, to remove various materials. A person of ordinary skill in the art will recognize that the type of plasma used will depend on the material of which channel layer 410 is composed, or that other etch process, e.g., wet chemical etch or laser ablation, may be used. Similar to the process of epitaxially forming channel layer 410 in step 105, epitaxially forming semi-insulating layer 610 in step 115 includes matching the lattice constant of semi-insulating layer 610 to the lattice constant of bottom barrier 310. As a result of matching the lattice constant of bottom barrier 310 and semi-insulating layer 610, strain is induced onto channel layer 410 by semi-insulating layer 610. The location of semi-insulating layer 610 adjacent to channel layer 410 allows for strain to be induced to channel layer 410 from the sides in addition to the strain induced from below by bottom barrier 310. As depicted in FIG. 6B, in embodiments where devices are manufactured at pitch semi-insulating layer 610 must be formed on a source or drain region of the transistor such as source and drain region 510 of the CMOS transistor formed in step 110. In embodiments where devices are manufactured "at pitch", there may be no exposed portions of bottom barrier 310 on which semi-insulating layer 610 can be formed. In embodiments where semi-insulating layer 610 is formed on source and drain region 510, semi-insulating layer 610 and optionally source and drain region 510 may be intentionally lattice mismatched to channel layer 410. As a result of this lattice mismatching, the presence of semi-insulating layer 610 causes additional stress to be induced to channel layer 410.

Figure 7A:
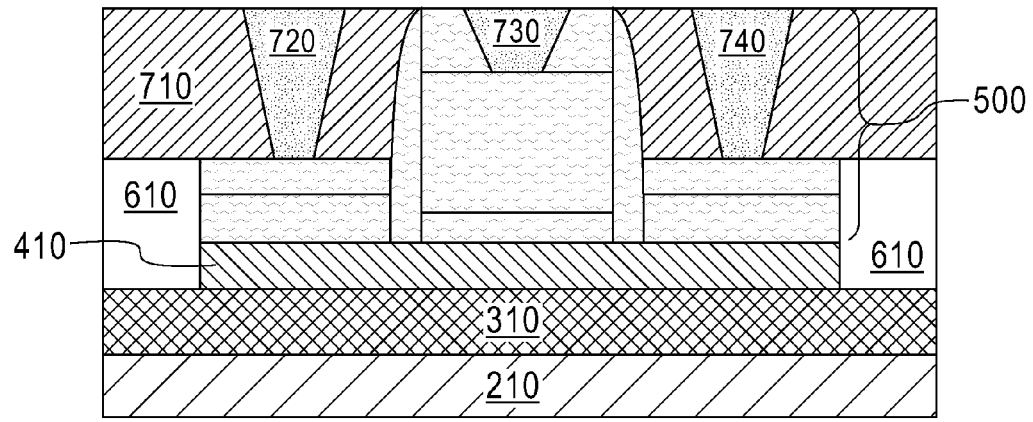
FIG. 7A illustrates partial etching of the semi-insulating layer of FIG. 6A, the deposition of an interlayer dielectric, and the formation of contacts, in accordance with an embodiment of the invention.

In step 120, interlayer dielectric 710 is formed over CMOS transistor 500 and the semi-insulating layer formed in steps 110 and 115, as described in greater detail with respect to FIGS. 7A. In various embodiments, interlayer dielectric 710 is a non-crystalline solid material with no definite lattice constant such as SiO2 or a low-K dielectric, and as a result interlayer dielectric 710 does not induce any significant amount of strain onto other components in contrast to the way that semi-insulating layer 610 or bottom barrier 310 does. In general, the purpose of interlayer dielectric 710 is to electrically insulate CMOS transistor 500 from any other transistors or other electrical components placed near CMOS transistor 500. In some embodiments, interlayer dielectric 710 is used to reduce the parasitic capacitance of the device by reducing the electric field present between the contact for the gate terminal and the contact for an adjacent source or drain terminal. Additionally, in the depicted embodiment the step of depositing interlayer dielectric 710 includes the formation of metal contacts 720, 730, and 740 to facilitate the connection of the gate, source, and drain terminals of CMOS transistor 500 with outside electrical components.

Figure 2:
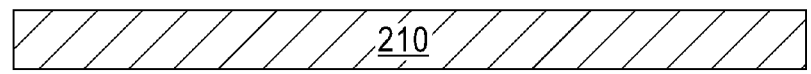
FIG. 2 is a cross sectional view of a semiconductor substrate upon which a MOSFET structure may be fabricated, in accordance with an embodiment of the invention.
Figure 3:
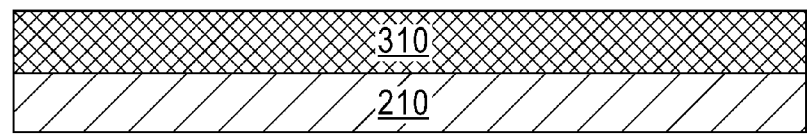
FIG. 3 depicts the formation of a semi-insulating bottom barrier on the semiconductor substrate of FIG. 2, in accordance with an embodiment of the invention.

FIG. 2 is a cross sectional view of a semiconductor substrate 210 upon which a MOSFET structure may be fabricated, in accordance with embodiments of the invention. Semiconductor substrate 210 is a semiconductor material, preferably a silicon-containing material including, but not limited to, silicon, germanium, silicon germanium alloys, germanium alloys, indium alloys, silicon carbon alloys, or silicon germanium carbon alloys. It should be appreciated by one skilled in the art that the invention is not limited to SOI construction, and that other semiconductor substrates may be used, for example, silicon-containing materials including, but not limited to, silicon, silicon germanium alloys, silicon carbon alloys, or silicon germanium carbon alloys FIG. 3 depicts the formation of bottom barrier 310 on semiconductor substrate 210, in accordance with the depicted embodiment. In embodiments where channel layer 410 is formed directly on semiconductor substrate 210, the step of forming bottom barrier 310 may be omitted. In various embodiments, bottom barrier 310 is grown epitaxially using a process such as molecular beam epitaxy (MBE), metal organic chemical vapor deposition (MOCVD), or any other technique for epitaxially growing a layer of a semiconductor material. In some embodiments, bottom barrier 310 is a semi-insulating layer with a thickness between 10 nm and 100 nm, in accordance with various embodiments of the present invention. In various embodiments, bottom barrier 310 is composed of a semi-insulating semiconductor material such as doped indium phosphide or doped gallium arsenide. In various embodiments, bottom barrier 310 is indium phosphide (InP) which is made semi-insulating by incorporating dopants such as iron (Fe). In general, bottom barrier 310 is made semi-insulating by in-situ incorporation of dopants that create mid-gap states (for example, iron (Fe) doping can be used to create semi-insulating indium phosphide and chromium (Cr) doping can be used to create semi-insulating gallium arsenide). Depending on the lattice mismatch between semiconductor substrate 210 and bottom barrier 310 as well as the thickness of bottom barrier 310, bottom barrier 310 may be strained or not strained to different extents in various embodiments of the invention.

Figure 4:
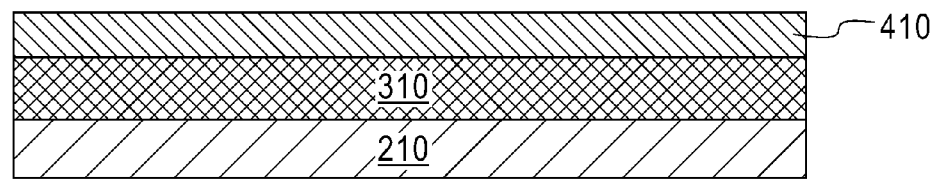
FIG. 4 illustrates formation of a channel on the bottom barrier of FIG. 3, in accordance with an embodiment of the invention.

FIG. 4 depicts the formation of channel 410 on bottom barrier 310, in accordance with the depicted embodiment of the invention. Channel layer 410 may be a III-V semiconductor layer with a thickness between 2 nm and 10 nm. In various embodiments, channel layer 410 is composed of a III-V semiconductor material such as indium phosphide, gallium arsenide, or indium gallium arsenide (InGaAs). In the depicted embodiment where bottom barrier 310 is composed of semi-insulating indium phosphide, channel layer 410 is composed of indium gallium arsenide. In general, bottom barrier 310 can be any semi-insulating III-V semiconductor material and channel layer 410 can be any III-V semiconductor material.

In various embodiments, channel layer 410 is grown epitaxially using a process such as molecular beam epitaxy (MBE), metal organic chemical vapor deposition (MOCVD), atomic layer deposition (ALD), or any other technique for epitaxially growing a layer of a semiconductor material. In various embodiments of the invention, the material of which bottom barrier 310 is formed has a different normal lattice constant or spacing from the material of which channel layer 410 is formed. Epitaxially growing a thin channel layer such as channel layer 410 on bottom barrier 310 causes the in-plane lattice constant of channel layer 410 to conform to the in-plane lattice constant of bottom barrier 310. Based on the Poisson ratio, modifying the in-plane lattice constant of a material results in an opposite change in the out-of-plane lattice constant of that material. For example, if epitaxially forming channel layer 410 on bottom barrier 310 results in channel layer 410 having a smaller in-plane lattice constant than it normally would, the out-of-plane lattice constant of channel layer 410 will be increased as a result. This effect of causing a change in the in-plane lattice constant and an opposite change in the out-of-plane lattice constant is herein referred to as a strain. In general, the in-plane lattice constant of channel layer 410 being reduced is referred to as compressive strain or compression while the in-plane lattice constant of channel layer 410 being increased is referred to as a tensile strain or tension. The introduction of strain to channel layer 410 is used to change the carrier transport properties (for example, carrier mobility) of channel layer 410. In various embodiments, the materials of which bottom barrier 310 and channel 410 are formed are selected based on the amount and type of strain which must be induced onto channel layer 410. In embodiments such as the depicted embodiment where channel layer 410 is composed of indium gallium arsenide, the ratio of indium to gallium arsenide can be varied in order to manipulate the natural in-plane lattice constant of channel layer 410 and as a result alter the amount of strain induced to channel layer 410. In the depicted embodiment, the MOSFET structure is built on semiconductor substrate 210, bottom barrier 310, and channel layer 410.

FIG. 5 depicts the formation of complementary metal-oxide semiconductor (CMOS) transistor 500 on top of channel layer 410, in accordance with the depicted embodiment of the invention. A person of ordinary skill in the art will recognize that the process for fabricating CMOS transistor 500 on a substrate is well-known and many different types and designs of CMOS transistors can be used in various embodiments of the invention. In the depicted embodiment, CMOS transistor 500 formed on channel layer 410 is a raised source drain (RSD) transistor including a gate dielectric, a gate electrode, a hard mask, two dielectric sidewall spacers, and RSD contacts for source and drain, as depicted in FIG. 5. In various embodiments of the invention, CMOS transistor 500 can be either an n-channel transistor or a p-channel transistor depending on the desired properties of CMOS transistor 500.

Figure 6A:
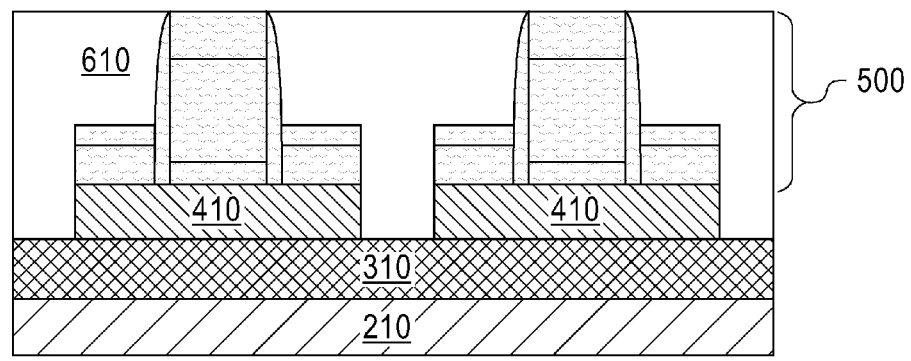
FIG. 6A illustrates epitaxial growth of a semi-insulating layer on the bottom barrier within the semiconductor substrate of FIG. 1, in accordance with an embodiment of the invention.
Figure 6B:
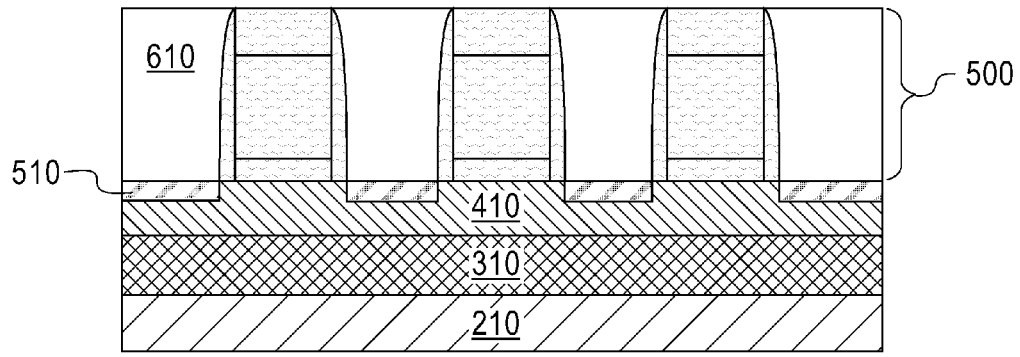
FIG. 6B illustrates epitaxial growth of a semi-insulating layer on a source and drain region of the CMOS transistor of FIG. 4, in accordance with an embodiment of the invention.

FIGS. 6A and 6B depict the formation of semi-insulating layer 610 in two embodiments of the invention. In general, FIG. 6A depicts an embodiment where the density of components such as the current MOSFET transistor is not of interest while FIG. 6B depicts an embodiment where the density of components such as the current MOSFET transistor is of interest and devices are manufactured "at pitch". The formation of semi-insulating layer 610 in both FIGS. 6A and 6B results in a strain being induced to channel layer 410. Inducing a strain onto channel layer 410 results in a change to the conductivity of channel layer 410. In various embodiments of the invention, semi-insulating layer 610 is composed of a III-V semiconductor material such as indium phosphide or gallium arsenide and is made to be semi-insulating by incorporating dopants such as iron (for InP) or chromium (for GaAs). The introduction of dopants effectively traps carriers (electrons and holes), and by doing so can be used to make a given layer semi-insulating.

FIG. 6A depicts an embodiment of the invention where semi-insulating layer 610 is grown epitaxially on bottom barrier 310 adjacent to channel layer 410. In general, the embodiment depicted in FIG. 6A is used when devices are not manufactured "at pitch", such as embodiments where the density of components such as the current MOSFET transistor is not of interest such as analog circuits with only a few hundred devices where circuit density is not an important limitation. In various embodiments, a difference between the lattice constant of the material comprising channel layer 410 and the material comprising semi-insulating layer 610 results in a strain being induced onto channel layer 410 and no strain being induced onto bottom barrier 310. In various embodiments, a strain can comprise either tension or compression of varying strength depending on the desired change in the conductivity of channel layer 410 for that particular embodiment. Semi-insulating layer 610 is deposited using, for example, MOCVD. It should be appreciated by one skilled in the art that additional CMP steps may be present after the deposition of semi-insulating layer 610 to remove any portions of semi-insulating layer 610 present above the top of CMOS transistor 500 and planarize the top of semi-insulating layer 610 to be even with the top of CMOS transistor 500. It should be appreciated that the depicted embodiment of FIG. 6A has been modified to illustrate the separation between adjacent devices, and that both previous and future figures refer to the same embodiment with the second device omitted.

FIG. 6B depicts a second embodiment where semi-insulating layer 610 is formed on CMOS transistor 500, in accordance with an embodiment of the invention. In general, the embodiment depicted in FIG. 6B is used when devices are manufactured "at pitch", such as embodiments where the density of components such as the current MOSFET transistor is of interest such as the fabrication of microprocessors, compact memory components, or any electronic device where the density of electrical components is important. In the depicted embodiment, CMOS transistor 500 includes source and drain region 510 which forms the source and drain terminals of the current MOSFET device. In embodiments where the current MOSFET device is an NFET, source and drain region 510 is composed of InGaAs doped with, for example, silicon, tin, or tellurium. In embodiments where the current MOSFET device is a PFET, source and drain region 510 is composed of InGaAs doped with, for example, carbon, beryllium, or zinc. In the depicted embodiment, source and drain region 510 acts as a common source or drain for two consecutive MOSFET devices, and as a result no portion of bottom barrier 310 is exposed to form semi-insulating layer 610 on. In these embodiments, semi-insulating layer 610 induces strain onto channel layer 410 through source and drain region 510.

In embodiments where source and drain region 510 is formed in channel layer 410, source and drain region 510 can be formed using ion implantation to dope a portion of channel layer 410 with the desired n-type or p-type dopants required to form source and drain region 510. In other embodiments where source and drain region 510 is formed in channel layer 410, the upper portion of channel layer 410 is etched using the gate terminal and spacers of CMOS transistor 500 as a hard mask. Source and drain region 510 is then formed in the etched region using in-situ doping to incorporate the desired dopants. In embodiments where source and drain region 510 is formed above channel layer 410 to create a raised source drain (RSD) design, source drain region 510 is grown in the regions between consecutive gate terminals above channel layer 410.

In various embodiments of the invention, both NFET and PFET devices are included on the same substrate. In these embodiments, source and drain region 510 must be doped with different elements depending on whether the MOSFET device being fabricated is an NFET device or a PFET device. If both devices are to be created on the same substrate, the portion of devices which are to be PFET devices can be covered with an oxide layer while source and drain region 510 for the NFET devices is fabricated. Once fabrication of source and drain region 510 for the NFET devices is completed, the oxide layer can be removed and the NFET devices are covered with an oxide layer while source and drain region 510 for the PFET devices is created.

Figure 7B:
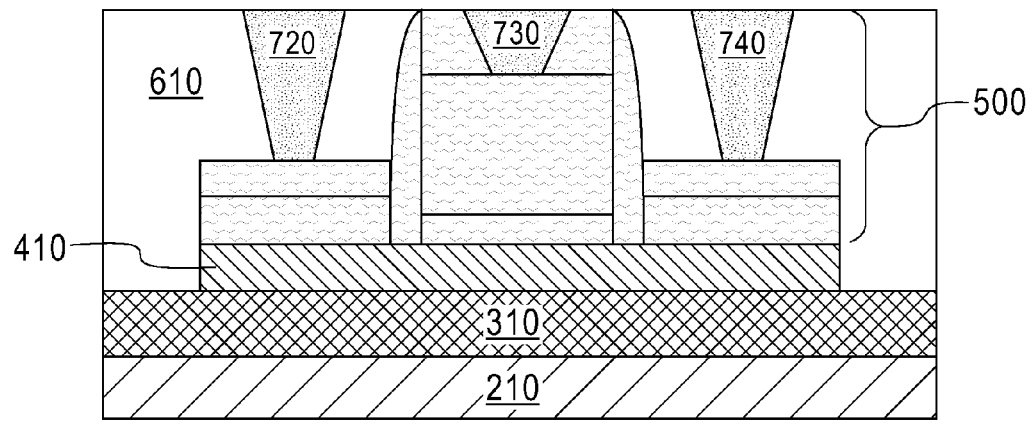
FIG. 7B illustrates formation of contacts, in accordance with an embodiment of the invention.

FIGS. 7A and 7B depict the deposition of interlayer dielectric 710 and the formation of contacts 720, 730, and 740 in accordance with various embodiments of the invention. In general interlayer dielectric 710 composed of a low-K dielectric used to reduce the parasitic capacitance of the device. In various embodiments, a portion of semi-insulating layer 610 must be etched in order to make room for interlayer dielectric 710. In these embodiments, semi-insulating layer 610 is removed using, for example, RIE. A person of average skill in the art will recognize that the type of plasma used in the RIE process will depend on the composition of semi-insulating layer 610. Interlayer dielectric 710 reduces the parasitic capacitance of the device by reducing the electric field present between the contact for a gate terminal of the current MOSFET transistor and a contact for an adjacent source or drain terminal. Interlayer dielectric 710 is deposited over CMOS transistor 500 and semi-insulating layer 610 in embodiments of the invention such as the embodiment depicted in FIG. 7A. In various embodiments, interlayer dielectric 710 is overgrown slightly beyond the top of CMOS transistor 500 and a process such as chemical-mechanical planarization (CMP) is used to reduce the height variations in the topography of interlayer dielectric 710 and remove excess portions of interlayer dielectric 710 present above the top of CMOS transistor 500 and level the top of interlayer dielectric 710. CMP may use a combination of chemical etching and mechanical polishing to smooth the surface and even out any irregular topography. In embodiments where the parasitic capacitance of the device is less important, such as the embodiment depicted in FIG. 7B, interlayer dielectric 710 may be absent from the MOSFET device.

A person of ordinary skill in the art will recognize that the formation of contacts 720, 730, and 740 includes the steps of etching a portion of interlayer dielectric 710, semi-insulating layer 610, or a hard mask above the gate material of CMOS transistor 500 and depositing a contact material into the etched portion of the layer. A contact material can comprise a metal such as tungsten, titanium, titanium nitride, or copper, and be deposited by a process such as chemical vapor deposition (CVD). After the contact metal used to form contacts 720, 730, and 740 is deposited, CMP may be used to remove excess contact material stopping at the top of interlayer dielectric 710 or semi-insulating layer 610. Although FIGS. 7A and 7B depict the formation of contacts in embodiments where the current MOSFET device is not manufactured "at pitch", it should be appreciated that similar contacts are formed in embodiments where the current MOSFET device is manufactured "at pitch". Additionally, in these embodiments where the current MOSFET device is manufactured "at pitch", a portion of semi-insulating layer 610 may be etched and replaced with an interlayer dielectric similar to the embodiment depicted in FIG. 7A.

The method as described above is used in the fabrication of integrated circuit chips.

The resulting semiconductor device may be included on a semiconductor substrate consisting of many devices and one or more wiring levels to form an integrated circuit chip. The resulting integrated circuit chip(s) can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having described preferred embodiments of a MOSFET device with a strained channel and relaxed bottom barrier (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. A method for constructing a MOSFET semiconductor device, the method comprising:
    epitaxially forming a channel on a bottom barrier, wherein the bottom barrier is semi-insulating, and strain is induced onto the channel;
    forming a gate structure on the channel;
    forming a source region and a drain region on the channel laterally adjacent to the gate structure; and
    epitaxially forming a semi-insulating layer of a height laterally adjacent to the channel on the bottom barrier, wherein the semi-insulating layer induces a strain onto the channel.

2. The method of claim 1, wherein the composition of the semi-insulating layer is selected to change carrier transport properties of the channel.

3. The method of claim 1, wherein the strain is induced by forming a material with a first lattice constant on a material with a second lattice constant.

4. The method of claim 1, wherein the strain induced onto the channel comprises tension.

5. The method of claim 1, wherein the strain induced onto the channel comprises compression.

6. The method of claim 1, wherein the height of the semi-insulating layer is greater than or equal to 2 nm and less than or equal to 100 nm.

7. The method of claim 1, further comprising:
    forming an interlayer dielectric on the semi-insulating layer.

* * * * *